US005537103A

United States Patent [19]

Lavelle et al.

[11] Patent Number: 5,537,103

[45] Date of Patent: Jul. 16, 1996

[54] PROGRAMMER FOR CONTACT READABLE ELECTRONIC CONTROL SYSTEM AND PROGRAMMING METHOD THEREFOR

[75] Inventors: Gary E. Lavelle, Avon; George Frolov, Farmington, both of Conn.

[73] Assignee: Harrow Products, Inc., Grand Rapids, Mich.

[21] Appl. No.: 65,185

[22] Filed: May 20, 1993

[51] Int. Cl.[6] .............................. G06F 7/04; G06K 7/01; H05K 7/02

[52] U.S. Cl. .............................. 340/825.310; 235/382.5; 340/825.3; 361/737

[58] Field of Search .............................. 340/825.31, 825.34, 340/825.3, 306, 825.52; 235/382, 382.5, 441, 492, 383; 341/23, 176; 361/733, 737

[56] References Cited

U.S. PATENT DOCUMENTS

| | | | |
|---|---|---|---|
| 2,508,953 | 5/1950 | Knutsen | 235/492 |
| 3,924,242 | 12/1975 | Naud . | |
| 4,558,175 | 12/1985 | Genest et al. | 340/825.34 |
| 4,677,284 | 6/1987 | Genest | 340/825.31 |
| 4,825,058 | 4/1989 | Poland | 235/383 |
| 4,999,622 | 3/1991 | Amano et al. | 341/176 |
| 5,021,776 | 6/1991 | Anderson et al. | 340/825.34 |
| 5,045,675 | 9/1991 | Curry | 235/492 |
| 5,157,244 | 10/1992 | Mroczkowski et al. | 235/441 |
| 5,285,200 | 2/1994 | Kuriyama | 340/825.34 |

FOREIGN PATENT DOCUMENTS

| | | | |
|---|---|---|---|
| 103597 | 5/1988 | Japan | 341/176 |

*Primary Examiner*—Alyssa H. Bowler
*Assistant Examiner*—Mark H. Rinehart
*Attorney, Agent, or Firm*—Chilton, Alix & Van Kirk

[57] ABSTRACT

Programmers for an entry control system, which operates to automatically control access to an area upon contact of an electronic key with a data port, employ data carriers housing ROM chips. The chips have a unique data code which corresponds to an elemental key or a code. In one form of the programmer, a membrane keypad addresses the ROM chips for inputting commands to program a controller. In other embodiments, the programming chips are mounted to a flexible board and are positionable to directly contact a receptacle port for the controller.

8 Claims, 11 Drawing Sheets

COMMAND LIST

BASIC:

| | |
|---|---|
| [1 2] | CHANGE USER CODE |
| [3 4] | ADD USER CODE |
| [5 6] | DELETE USER CODE |
| [7 8] | CHANGE MASTER CODE |

ADVANCED:

| | |
|---|---|
| [1 2] [1 2] | CHANGE USER CODE / FUNCTIONS |
| [3 4] [3 4] | ADD USER CODE / FUNCTIONS |
| [5 6] [5 6] | DELETE USER CODE WITH ALARM |
| [7 8] [7 8] | DISPLAY VERSION NUMBER |
| [7 8] [7 8] [7 8] | INITIALIZE PROGRAMMER |
| [9 0] | CONFIGURE SYSTEM |
| [9 0] [9 0] | CONFIGURE SYSTEM |
| [9 0] [9 0] [9 0] | CONFIGURE DELAY EGRESS |

*FIG. 11*

PROGRAMMER FOR CONTACT READABLE ELECTRONIC CONTROL SYSTEM AND PROGRAMMING METHOD THEREFOR

BACKGROUND OF THE INVENTION

This invention relates generally to control systems which employ a reader to control access to a restricted area. More particularly, the present invention relates generally to control systems which employ a reader for receiving data upon contact by a data carrier having a memory chip.

Control systems to which the invention relates employ automatic electronic controllers. The controllers respond to readers which have an input receptacle. A data carrier having a memory chip which includes a pre-established data code is manually inserted into the receptacle. Upon contact, the code is read into the controller. The controller may be employed to generate suitable signals in response to the code to, for example, provide access through an entranceway, to control inventory, to record the presence of an individual at a location, and numerous other applications.

A data carrier, such as a carrier marketed by Dallas Semiconductor as a DS 1990 Touch Serial Number, essentially functions as a key of an electronic serial number for automatic identification. The carrier includes a 64 bit ROM which stores data that is transferred serially upon contact with the reader. The carrier is coin-shaped and includes a durable stainless steel case. The carrier is typically mounted to a panel, a key ring, a clip, an adhesive pad, a photograph identification card or another accessory which facilitates portability and accessibility.

For applications wherein the controller functions to control access to an area, readers are installed adjacent to the entranceways. The reader electronically communicates with a programmable controller. The data carriers essentially function as keys. Upon contacting the key with the reader, the data from the carrier is serially input into the controller. Conventionally, the controller is programmed to accept or reject various data codes to correspondingly automatically provide access to the area. Typically, the controller generates a signal for releasing an electromagnetic lock or other electrically operated lock in response to a valid code or password. The time of entry and the identification of the individual entering may also be recorded by the controller.

A keypad is also commonly provided in conjunction with the reader. The keypad may function to input a pass code or a supplemental code, or may be used to program the controller. For some automatic control systems, it may not be desirable in terms of cost, headroom constraints, security and other factors to provide a keypad with each reader—especially for access control systems where a large number of users must pass through an entranceway without delay. Access to a restricted area may be obtained through a relatively compact reader which primarily includes a LED and an input port in the form of a receptacle for mating with the data carrier.

In some automatic control systems to which the invention relates, one side of the entranceway contains an entry set which includes a keypad as well as a reader while the opposite side of the doorway has a reader but no keypad. Both readers are connected with the controller, and programming is performed through the keypad. However, in numerous other systems—especially relatively low cost systems, none of the controlled sides of the entryway are provided with a keypad. While such systems may function in an efficient manner through use of a pre-programmed controller and a pre-established set of data carriers, flexibility for such a system is highly restrictive unless additional programming of the controller can be implemented on an ongoing basis.

For entry and monitor control applications, it is highly desirable that the controller be programmable to delete or add codes as the set of authorized users is expanded, contracted or changed. Several devices have been employed to accomplish such programming. Among such devices are a cordless touchpen, a hand-held computer and a PC keyboard. Each of the foregoing are all employed to input commands to program the controller. For a basic control access system, minimal programming capability ordinarily consists of adding or deleting passcodes as keys are lost or as new keys are added to the system.

SUMMARY OF THE INVENTION

Briefly stated, the invention in a preferred form is a programmer that is particularly adapted for an entry control system for controlling access to a restricted area. The control system comprises a controller having a programmable processor for establishing a passcode and comparing an input code to the passcode and for selectively generating an output signal in response to the comparison. A contact activatable data port communicates with the processor. The data port is adapted for receiving an input from a ROM, a RAM or other memory chip upon contact with a case housing the chip.

The programmer comprises a plurality of ROM program chips each having a unique elemental code. The programmer communicates with the input port for programming the processor to redefine the passcode. A keypad is employed for selectively addressing each of the ROM program chips. The keypad in one embodiment, includes a membrane which overlays a plurality of electrical switches corresponding to each of the program chips. The programmer may further include a receptacle to provide a contact activatable data port which is communicable with a key for the control system. There are six program chips. The program chips are mounted in sockets of a board.

In another embodiment, the program chips are fixedly mounted to integral fingers of a flexible board. The chips are affixed with an elemental code which corresponds to a keypad designation. Identification for each of the ROM program chips is affixed to the opposite side of the board. Programming is accomplished by selecting the appropriate ROM program chip and inputting the code from the chip by direct contact with the input port of the control system.

An object of the invention is to provide a new and improved programmer and programming method for a contact reader control system.

Another object of the invention is to provide a new and improved programmer for a contact reader control system which programmer is relatively inexpensive.

Another object of the invention is to provide a new and improved programmer and method for deleting valid control system codes without requiring actual possession of the chip having the code to be deleted.

A further object of the invention is to provide a new and improved hand-held programmer which can be employed to program a contact reader controller in an efficient and a reliable manner.

A yet further object of the invention is to provide a new and improved compact programmer and programming method having a low cost and efficient construction which can be used to add or delete password codes for an automatic entry control system.

Other objects and advantages of the invention will become apparent from the drawings and the specification.

BRIEF DESCRIPTION OF THE DRAWINGS

FIG. 11 is a table illustrating representative commands for the programmer of FIG. 1;

DETAILED DESCRIPTION OF THE PREFERRED EMBODIMENTS

Figure 1:
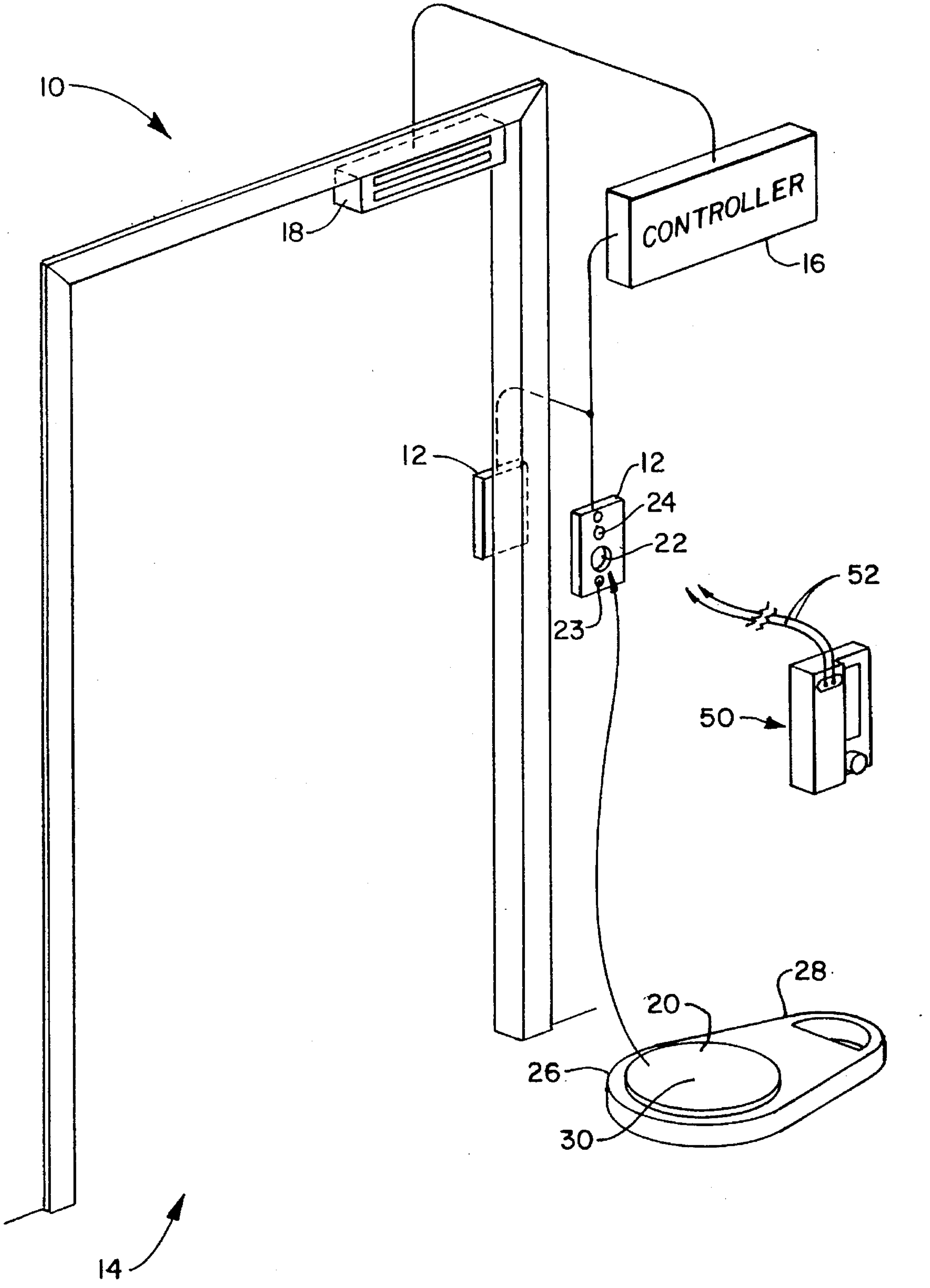
FIG. 1 is a schematic view of an access control system employing a programmer in accordance with the present invention.
Figure 2:
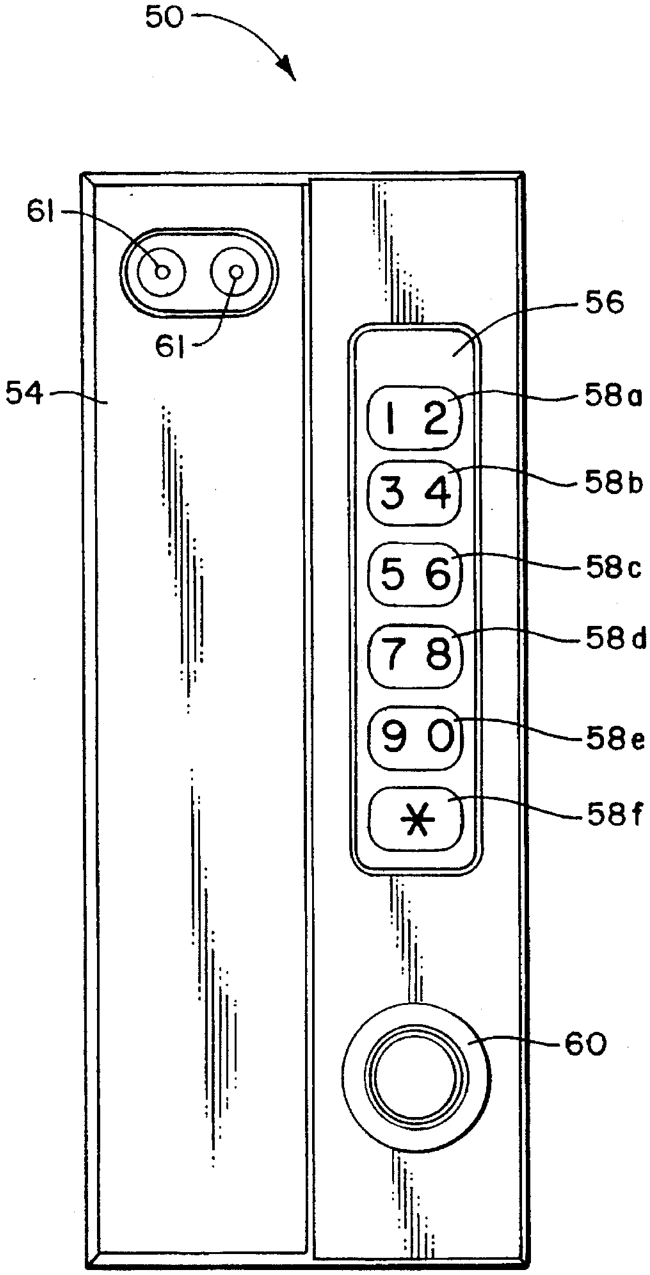
FIG. 2 is a top plan view of a programmer in accordance with the present invention.
Figure 3:
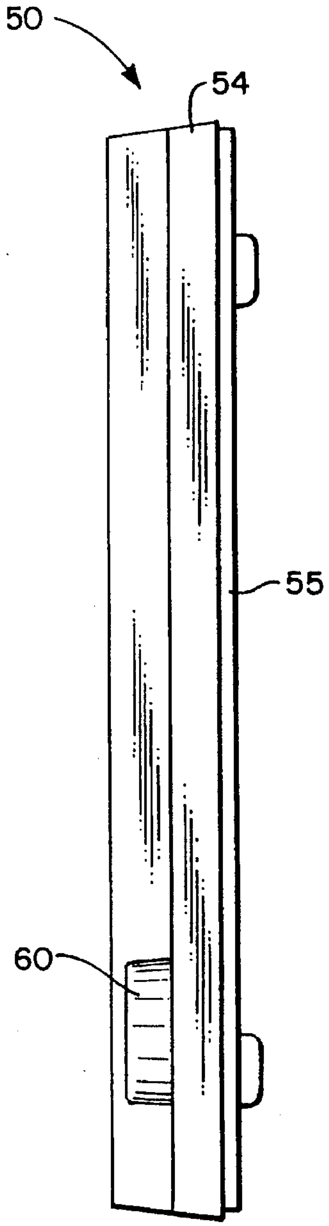
FIG. 3 is a side view of the programmer of FIG. 2 viewed from the right thereof.
Figure 4:
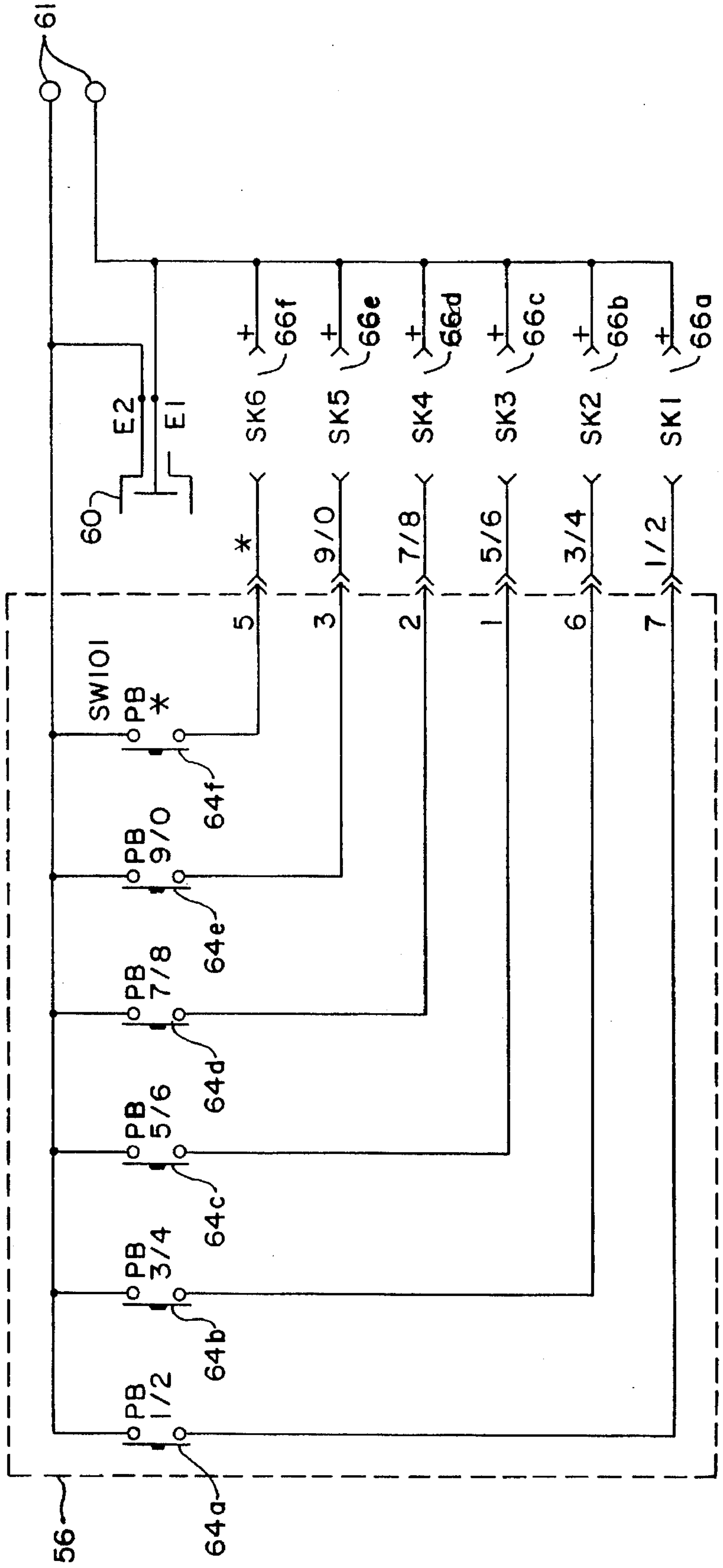
FIG. 4 is a schematic diagram of the circuitry for the programmer of FIG. 2.
Figure 5:
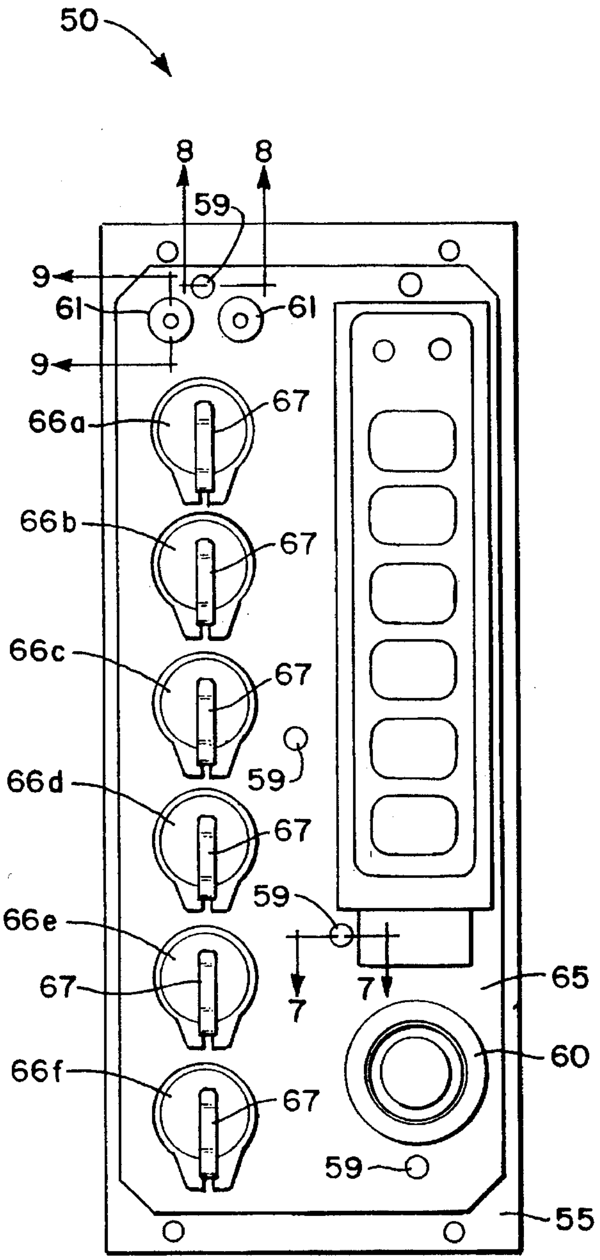
FIG. 5 is a top interior view of the programmer of FIG. 2 with the cover being removed.
Figure 6:
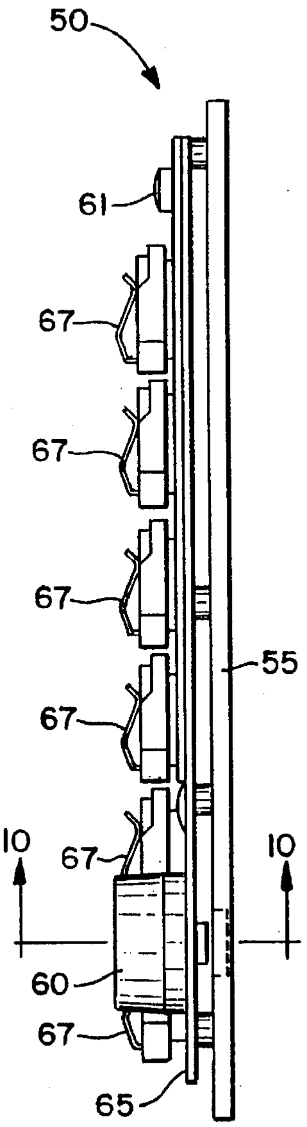
FIG. 6 is a side interior view of the programmer of FIG. 5 viewed from the right thereof.
Figure 7:
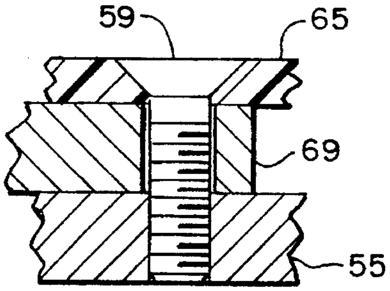
FIG. 7 is an enlarged fragmentary sectional view of the programmer of FIG. 5 taken along the line of 7—7 thereof.
Figure 8:
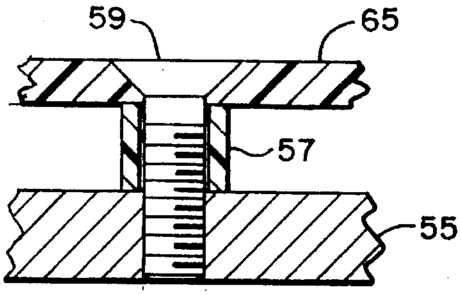
FIG. 8 is an enlarged fragmentary sectional view of the programmer of FIG. 5 taken along the line of 8—8 thereof.
Figure 9:
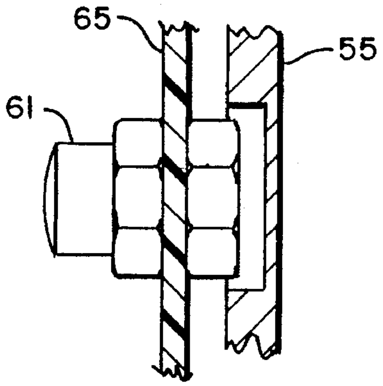
FIG. 9 is an enlarged fragmentary sectional view of the programmer of FIG. 5 taken along the line 9—9 thereof.
Figure 10:
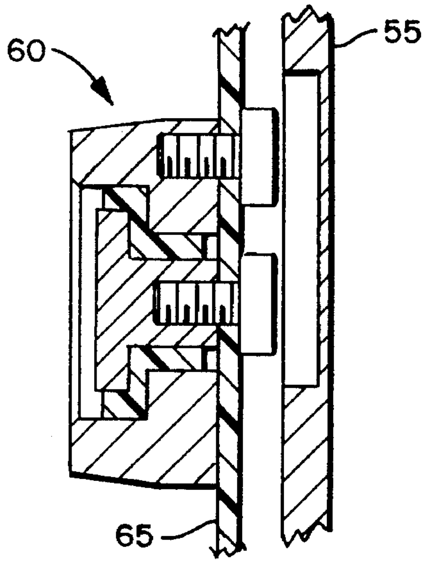
FIG. 10 is an enlarged fragmentary sectional view of the programmer of FIG. 6 taken along the line 10—10 thereof.

With reference to the drawings wherein like numerals represent like parts throughout the figures, an access control system is generally designated by the numeral 10 in FIG. 1. The access control system 10 includes a pair of reader modules 12 which are located at opposed sides of an entryway 14. The readers 12 communicate with a programmable electronic controller 16 which generates a signal for controlling access to a restricted area, such as via an electromagnetic lock 18.

Access to the restricted area is automatically obtained by means of an electronic key 20 in the form of a compact data carrier. The key 20 is inserted into an input receptacle 22 of a reader module 12. Upon contact, data is input from the key 20 to the controller 16. The controller has a programmable processor which is programmed to determine whether the data constitutes a valid password or code for permitting access to the restricted area. The reader module 12 typically has two pin sockets 23 for communicating via two leads with a programmer. Each reader module 12 also preferably has an LED 24 which provides visual indication that the key 20 is communicating with the reader module 12.

Electronic key 20 preferably is a data carrier which includes a coin-like steel case 26. The case houses a ROM (read-only memory) chip 30. The key 20 may be mounted to a fob 28, a card, a clip or other accessory to facilitate retention and manual manipulation of the key. A preferred embodiment of the key 20 is a DS 1990 Touch Serial Number data carrier marketed by Dallas Semiconductor. The key ROM chip 30 is a 64 bit ROM which essentially functions as an electronic password for automatic identification. Data from the ROM chip 30 is transferred serially via a one wire protocol to the mating receptacle 22. Alternately, the key 20 may have a RAM (random-access memory), EPROM (erasable programmable read-only memory) or EEPROM (electrically erasable programmable read-only memory) chip.

It should be appreciated that in accordance with the present invention, the reader module 12 and controller 16 may be employed in applications such as an inventory control system, a personnel tracking system, a tool management system and numerous applications other than the access control system 10.

The data from the ROM chip 30 is accessed via a single data line which employs a one wire protocol. The key essentially functions as a slave which cooperates with the bus master of the controller or micro controller 16. The memory map of the ROM chip 30 typically may have an 8 bit CRC code, a 48 bit serial number and an 8 bit family code.

For a given system, there may be as many as hundreds of electronic keys 20 which have a ROM chip 30 fixed with a unique data code. The controller is initially programmed to accept a pre-established subset of the entire group of the codes. As the set of authorized users increases and additional keys are issued, the controller is updated or programmed to include verification information for the newly issued keys so that the new keys may provide access to the restricted area. If a given key which has previously been issued, has been lost or it is otherwise desired to delete access for a given key, the controller is also programmed to process the data input by the key so that the given password no longer is a valid password.

In accordance with the invention, a programmer 50 is employed to program the controller 16 by interfacing through the reader module 12. Programmer 50 is a compact hand-held device which connects via two leads 52 with the pin socket 23 of the reader module for programming the controller. For example, the programmer may input data as new keys are issued so that the new keys will be accepted by the controller and or the programmer may input data so that certain previously coded keys may be deleted from the system and no longer provide authorized access as previously described. The programmer also may be employed to accomplish various other programming tasks.

With reference to FIGS. 2 through 10, programmer 50 has a rigid housing formed from a cover 54 which mounts onto a base 55. A keypad 56 is located at one side of the top face of the housing. The keypad 56 may include a series of depressable buttons or a membrane-type keyboard as illustrated. Essentially six input keys 58*a–f* defined at discrete locations of the membrane are employed for the illustrated keypad 56. An input port or receptacle 60 disposed at the cover of the housing receives and mates with a key 20.

The keypad 56 has a membrane 62 which overlays switches 64*a*–*f*. The switches 64 communicate via circuitry affixed to a circuit board 65. The keypad, switches and associated circuitry may be manufactured as a compact unit and mounted to the circuit board and electrically connected by pin connectors. The switches 64 are spring biased and are responsive to external depressable contact against the keys 58 to close an electrical contact to thereby address a corresponding ROM chip 66*a*–*f* mounted to the circuit board 65. The chips 66 are fastened in position to the circuit board 65 by resilient sockets 67 which are mounted through holes in the circuit board. A preferred socket is a Version DS 9094 microcan clip manufactured by Dallas Semiconductor. The ROM chips are preferably identical in form and function to the data carriers which are employed as the keys. Each of the ROM chips 66 are pre-coded with an elemental data code which corresponds to the keypad designation. The signals applied to the corresponding ROM chips 66 enable the data to communicate via the wire leads 52 which connect with the reader module 12. Thus, the programmer 50 essentially functions to closely replicate the data format of contacting a key 20 in the input receptacle 22 of the reader module 12.

The circuit board 65 is spaced from the base 55 by cylindrical stand-off supports 57. Fasteners 59 extend through the supports 57 (FIG. 8) to secure the circuit board to the base. A metal plate 69 (FIG. 7) is positioned between the circuit board and the base below the keypad 56 to enhance the structural support of the keypad assembly.

A tandem pin-type terminal plug 61 for mating with the female connector of leads 52 mounts to the circuit board and is accessed through the front of the cover.

The programmer receptacle 60 may be employed so that a key may be relatively easily deleted or added to the control system. For example, a key to be added may be placed in the receptacle 60, and a command, which is implemented by pressing one or a sequence of keys 58, may be given. The LED 24 at the reader also indicates visually that the key has been entered into the system or changed or deleted. Typical commands for the programmer are illustrated in FIG. 11. Passcodes to be added, deleted or changed may also be entered directly through the keypad 56.

Flow charts which illustrate the procedures for communicating between the programmer 50 and the controller 16 and for enabling the processing of the data are illustrated in FIGS. 12 through 15.

Figure 12:
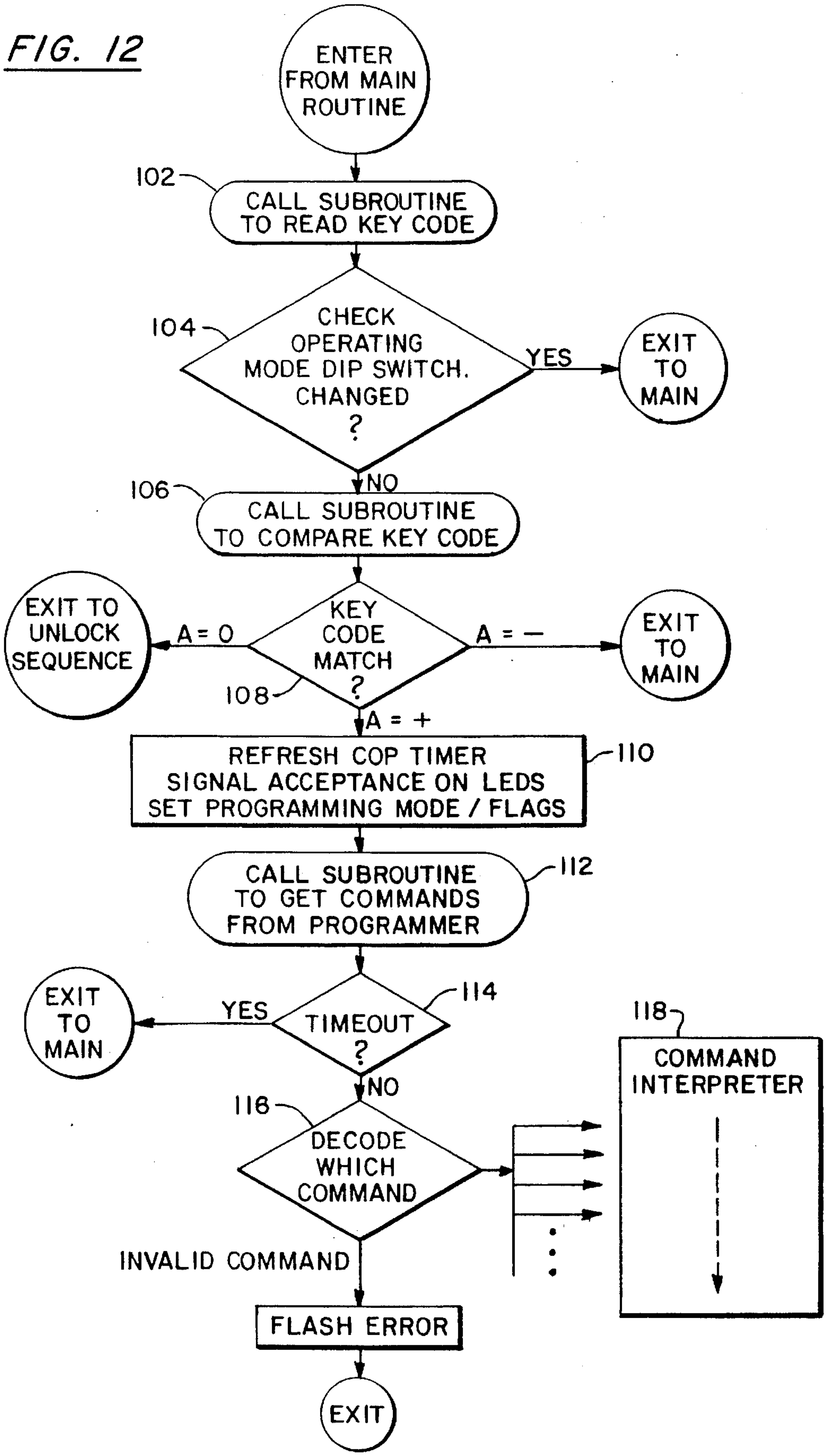
FIG. 12 is a flow chart illustrating a routine for initiating communication with the programmer in accordance with the present invention.

With reference to FIG. 12, the data from the key 20 is read at block 102, and a verification sub-routine is undertaken to verify that the data was read correctly. With reference to block 104, if the data input program (DIP) switch is changed, then the program returns to normal operation for a new configuration. If the DIP switch is not changed, then the data is read from the key 20 and processed with the data previously stored in the electrically erasable programmable read-only memory (EEPROM) of the controller 16 at block 106. This subroutine returns with the status of one of three results of a key code match at block 108 as set forth in Table I below.

TABLE I

| | |
|---|---|
| A = 0 | no match |
| A = + | master code match |
| A = − | user code match |

If an invalid code is identified, the program exits and returns to normal operation or waits for the entry of the next key. If the key has a valid code, then the controller generates a signal to unlock the electromagnetic lock 18. Other information such as the identity of the user and the time may also be recorded.

If a master key is accepted, the controller 16 enters a programming mode at block 110 where the functions are performed as required and the LED 24 is appropriately activated. The controller 16 then interfaces with the programmer 50 at block 112. With reference to block 144, if too much time has passed without receiving a valid command from the programmer 50, the controller returns to the normal operation. Otherwise, the controller performs the command functions as input from the programmer at blocks 116 and 118 as further set forth in FIGS. 13–15.

Figure 13:
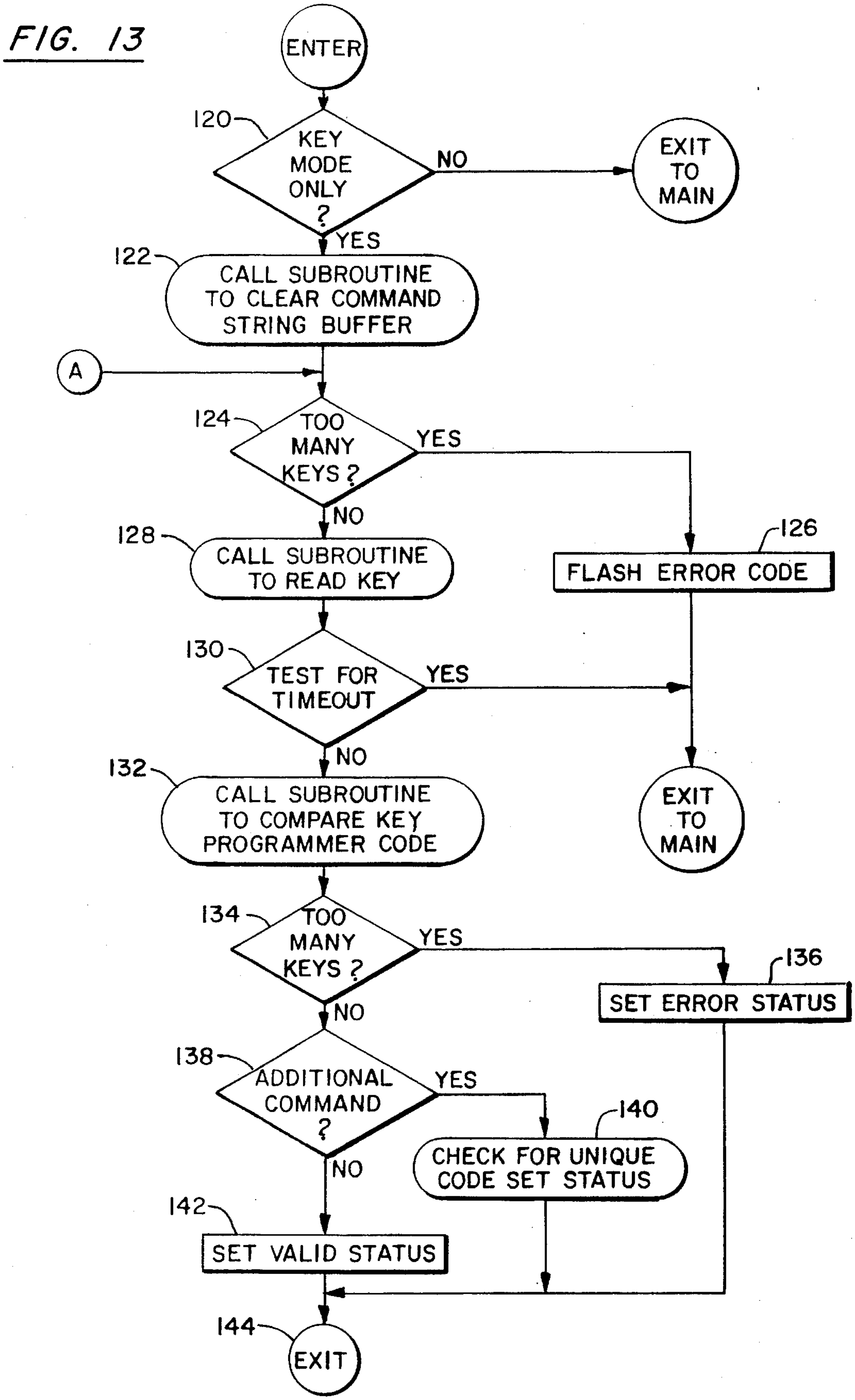
FIG. 13 is a flow chart illustrating a routine for the programmer of FIG. 1.

With reference to block 120 of FIG. 13, if the DIP switch is not in a normal reader only mode, then a flag is set and the sub-routine exits. Otherwise, a command string buffer is cleared at block 122. If the command string entry exceeds the maximum valid command string length at block 124, an error is recorded at block 126 and the sub-routine exits. The processor then reads the password at block 128 and verifies that the password was read correctly. With reference to block 130, if too much time elapses, then the sub-routine exits.

Figure 14:
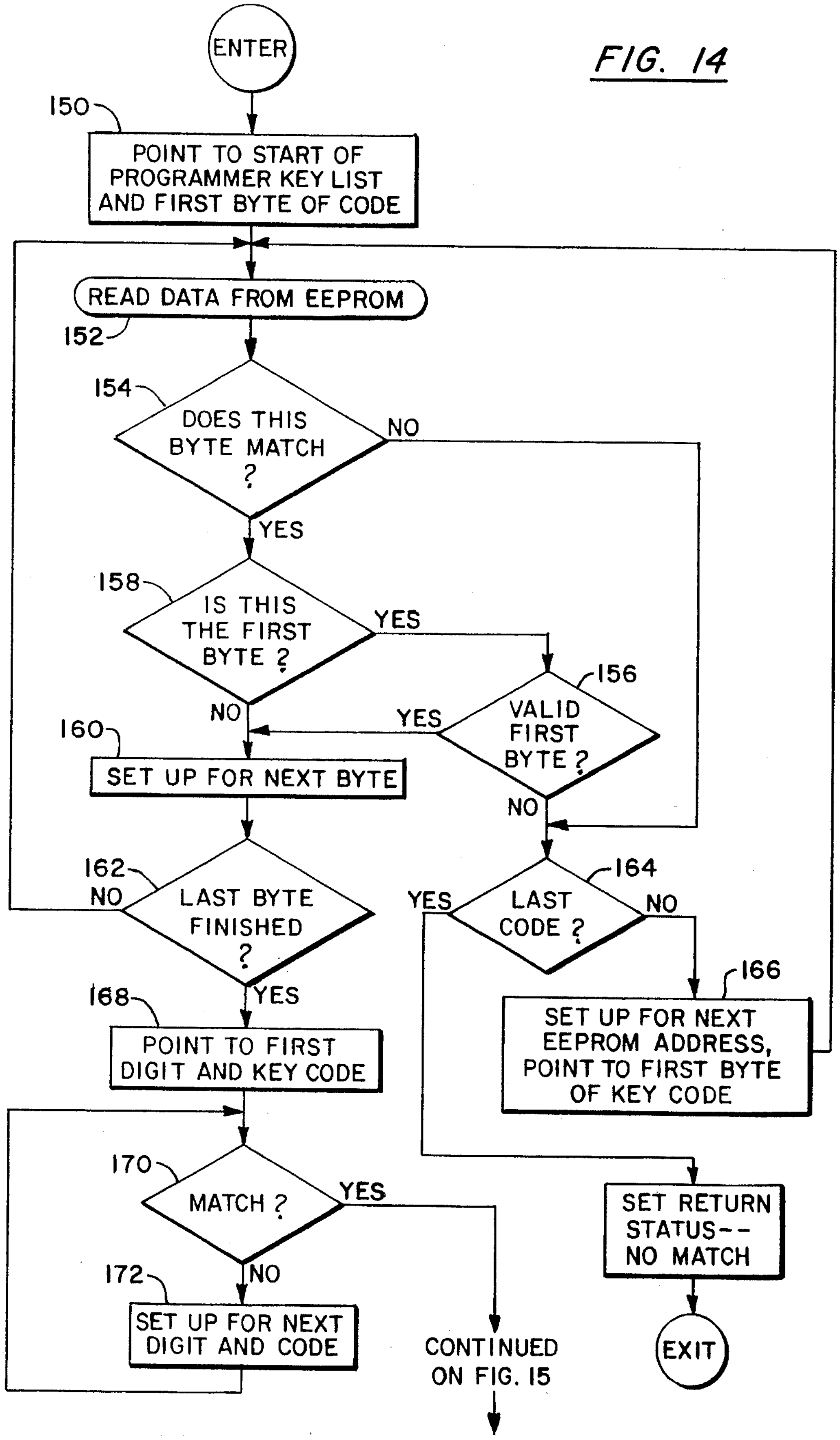
FIG. 14 is a flow chart illustrating a portion of a routine comparing carrier codes performed by the programmer of FIG. 1.
Figure 15:
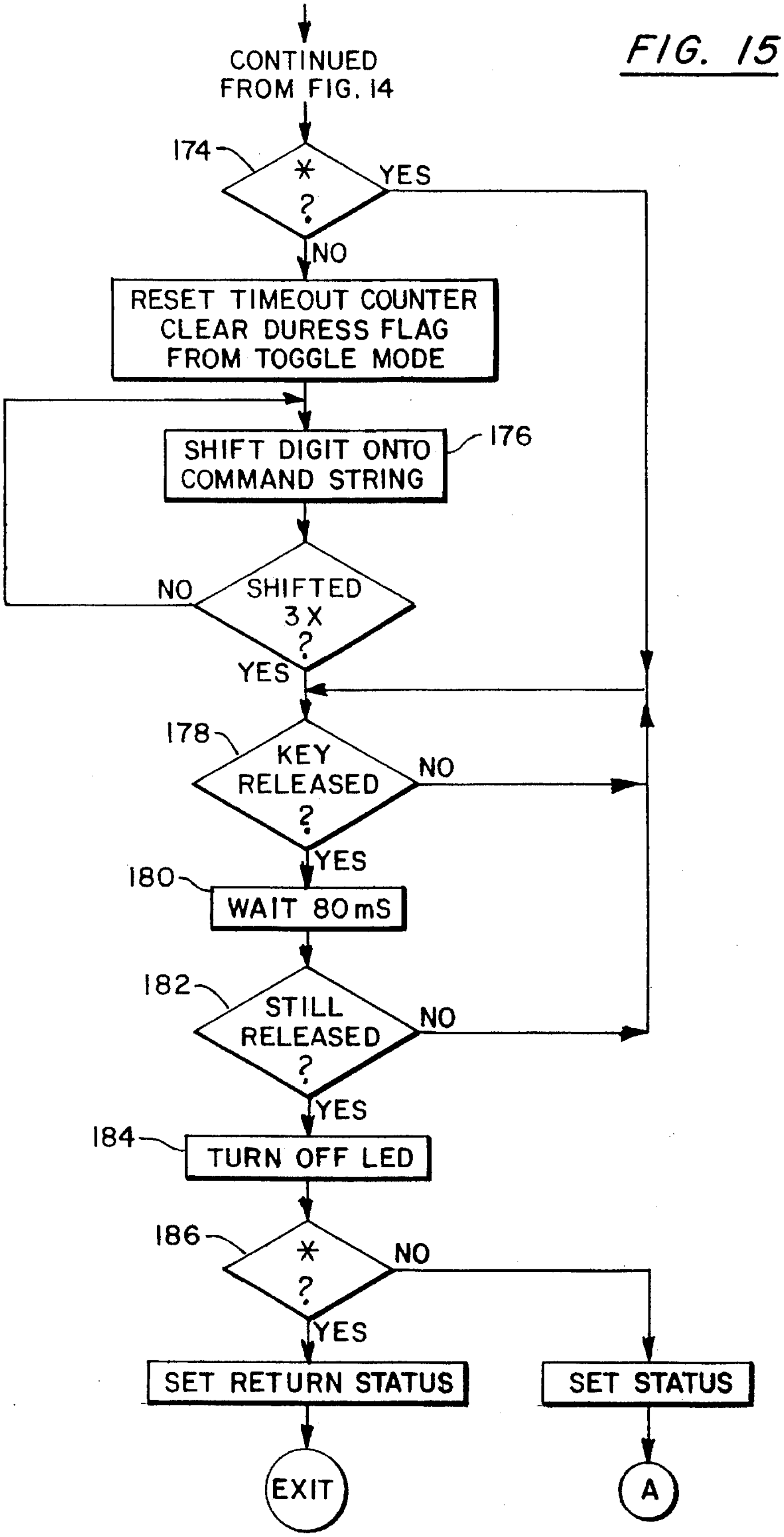
FIG. 15 is a flow chart illustrating a second portion of the routine for comparing codes of FIG. 14.

The procedure for processing the password and comparing it with programmer code stored in the EEPROM of the controller 16 (block 152) is illustrated in detail in FIGS. 14 and 15. With reference to blocks 134, 136, 138, 140, 142 and 144 of FIG. 12, the program then checks for errors, sets a return status and exits.

With reference to the comparison routine of FIG. 14, the program at block 150 starts with the first byte of the passcode and the first programmer code stored in the EEPROM of the controller to be read from the EEPROM at block 152, and a determination at block 154 is made whether there is a match. If the data is a first byte, a sub-routine at block 156 ensures that it is a valid password- type format. The comparison search is replicated at blocks 158, 160, 162, 164 and 166 until all of the password bytes and the EEPROM programmer codes have been compared. If there are no valid matches, a zero or no match status is recorded, and the program exits.

With reference to blocks 168, 170 and 172, if the password code matches the EEPROM code, the next process is to identify the keypad digit. The asterisk (key 58*f*) is used as a delimiter that is not entered into the command stream, so that the asterisk terminates the command entry. With reference to block 174 of FIG. 15, if the digit is an asterisk, the overhead functions are performed, and the digit is shifted onto the command stream at block 176. With reference to blocks 178, 180, 182 and 184, if the key is released, the pass code is removed from the reader. The LED 24 is then deenergized. The entry is complete, a check is made of the delimiter at block 186, and the next digit is processed as set forth in FIGS. 14 and 15. The command has thus been successfully entered in the command stream operation which completes the return for a normal process.

Figure 16:
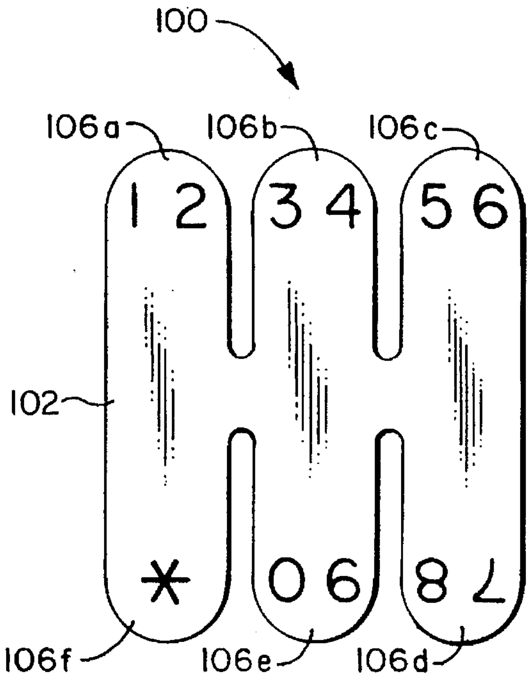
FIG. 16 is a top plan view of a second embodiment of a programmer in accordance with the present invention.
Figure 18:
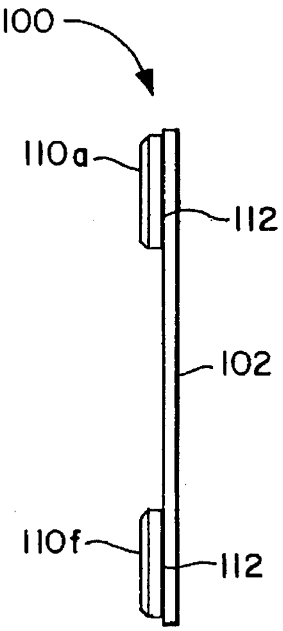
FIG. 18 is a side view of the programmer of FIG. 16 viewed from the left thereof.
Figure 17:
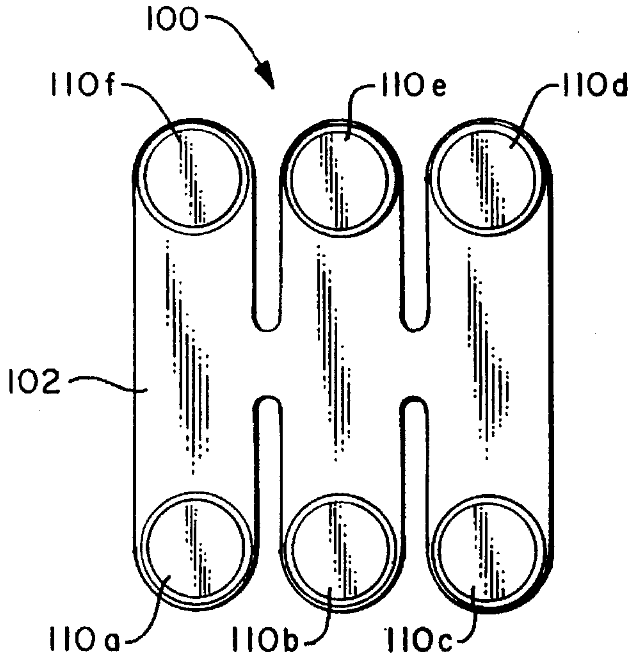
FIG. 17 is a bottom view of the programmer of FIG. 16.

With reference to FIGS. 16 through 18, a compact programmer is generally designated by the numeral 100. Programmer 100 employs a flexible card or board 102 having the shape of three opposed pairs of fingers. The card 102 may have a vinyl plastic composition. The top distal surfaces of the fingers are affixed with key board identification indicia 106*a*–*f*, such as illustrated in FIG. 16. The underside of each of the fingers mounts carriers 110*a*–*f* each having a unique ROM chip corresponding to the indicia 106*a*–*f* data. The carriers 110 are retained to the board 102 by means of double-sided tape 112 or other adhesive. The carriers 110 are similar in form and function to the data carriers employed as keys 20. Each of the chips is affixed with a unique data code which corresponds to the corresponding key indicia 106*a–f* on the top of the card 102.

Programming is physically accomplished via programmer 100 by sequentially positioning a carrier 110 (having a chip which corresponds to a given key or elemental code designation) in the input receptacle 22 of the controller. The program defines the specific chip and sequence. Representative commands are set forth in FIG. 11. The card is sufficiently flexible and the fingers sufficiently spaced to allow insertion of the appropriate carrier without interference from the rest of the programmer body.

Additional programmer embodiments (not illustrated) may employ a board having six arcuately spaced recesses. Chips are positioned in the recesses so as to be arranged in a circular array. The contact surfaces of the ROM chips extend below the board. The chips are permanently affixed to the board. Each of the chips is identified. The programming is physically accomplished by manipulating the board so that commands can be input into the reader by contacting the chips against the reader receptacle according to the pre-established program. In another programmer embodiment, the chips are removably mounted to a board and sequentially removed from the board for direct contact in the input receptacle of the reader as required.

While preferred embodiments of the invention have been set forth for purposes of illustration, the foregoing description should not be deemed a limitation of the invention herein. Accordingly, various modifications, adaptations and alternatives may occur to one skilled in the art without departing from the spirit and the scope of the present invention.

What is claimed is:

1. An entry control system for controlling access to an area comprising:

controller means comprising input means for receiving an input signal, programmable processor means communicable with said input means for establishing a passcode, comparison means for comparing an input code applied to said input means to said passcode, and signal means for selectively generating an output signal in response to said comparison;

data reader means for reading electronically recorded date, said data reader means comprising input port means for providing a contact activatable data port for communicating with said input means;

key means comprising a data chip having a code communicable with said controller means upon contact with said port means; and programmer means comprising a plurality of program chips each enclosed in a case and having a unique elemental code, each said unique elemental code being communicable with said reader means for programming said processor means to redefine said passcode, said programmer means further comprising board means for forming a support board, wherein said board means is a flexible member having a plurality of finger-like extensions and said program chips are mounted to said extensions.

2. The entry control system of claim 1 wherein said member has a first side and an opposite second side and said program chips are mounted to said first side and identification means for identifying said chips is affixed to said second side.

3. A programming device comprising:

board means for forming a mounting board, said board means comprising three linear sets of opposed pairs of finger-like extensions;

data carrier means comprising a plurality of cases, each case having an electrically conductive surface, and each housing a program chip fixed with a unique elemental code;

mounting means for mounting said cases to said board means so that each said surface is exposed and is engageable in a contact activatable electronic data chip reader; and identification means on said board means for identifying each program chip.

4. A method for programming a programmable processor which communicates via a contact activatable data port comprising:

providing a program comprising a sequence of commands constructed from a plurality of unique elemental codes for changing parameters of the processor;

providing a plurality of data carriers each comprising a case enclosing a data chip fixed with a unique elemental code of said program; and manually contacting said carriers against said data port in sequence according to the program.

5. The method of claim 4 wherein said plurality of data carriers are mounted to a board and further comprising sequentially positioning said board so that a selected carrier contacts said data port in a sequence according to said program.

6. The method of claim 4 wherein said data chips are ROM chips.

7. A programming device comprising:

board means comprising a flexible member which defines integral finger-like extensions;

data carrier means comprising a plurality of cases, each housing a program chip fixed with a unique elemental code;

mounting means for mounting one of each said case to one of said extensions; and identification means for Identifying each chip.

8. The programming device of claim 7 wherein there are three linear sets of opposed pairs of extensions.

* * * * *

UNITED STATES PATENT AND TRADEMARK OFFICE

CERTIFICATE OF CORRECTION

PATENT NO. : 5,537,103

DATED : July 16, 1996

INVENTOR(S) : Gary E. Lavelle et al

It is certified that error appears in the above-indentified patent and that said Letters Patent is hereby corrected as shown below:

Column 7, line 46, "date" should be --data--.

Column 8, line 52, "Identifying" should be --identifying--.

Signed and Sealed this

Fifth Day of November, 1996

Attest:

BRUCE LEHMAN

*Attesting Officer*

*Commissioner of Patents and Trademarks*